United States Patent [19]

Gould

[11] 4,355,376

[45] Oct. 19, 1982

[54] APPARATUS AND METHOD FOR UTILIZING PARTIALLY DEFECTIVE MEMORY DEVICES

[75] Inventor: Robert T. M. Gould, Downingtown, Pa.

[73] Assignee: Burroughs Corporation, Detroit, Mich.

[21] Appl. No.: 192,449

[22] Filed: Sep. 30, 1980

[51] Int. Cl.³ ............................................. G11C 13/00
[52] U.S. Cl. ..................................... 365/200; 365/230
[58] Field of Search ......................... 365/200, 189, 230

[56] References Cited

U.S. PATENT DOCUMENTS 4,047,163 9/1977 Choate ................................ 365/200
4,310,901 1/1982 Harding et al. .................... 365/200

Primary Examiner—Terrell W. Fears
Attorney, Agent, or Firm—Mark T. Starr; Kevin R. Peterson; Edmund M. Chung

[57] ABSTRACT

An apparatus and method of utilizing a group of partially defective memory devices in conjunction with a single faultfree memory device to form an effectively faultfree memory unit. Each of the partial devices and the faultfree device are characterized as requiring an address input to be presented in two segments at separate times during an access cycle. Each of the partial devices is characterized as having all of its respective faults within a contiguous address space, the group of partial devices configured to form one continuous addressable storage area. The first segment of the input address is presented to the group of partial devices and the faultfree device, and then a first stage access is initiated to all devices. Concurrently, the second segment of the input address is compared with the address combination which defines the faulty areas of the partial devices being accessed. If a match is obtained, the second segment of the input address is modified to specify an address in a portion of the faultfree device allocated for the corresponding partial device, and a second stage access is initiated to the faultfree device. If a match is not obtained, a second stage access is initiated to the group of partial devices utilizing the second segment of the unmodified input address.

24 Claims, 2 Drawing Figures

APPARATUS AND METHOD FOR UTILIZING PARTIALLY DEFECTIVE MEMORY DEVICES

BACKGROUND OF THE INVENTION

The present invention relates in general to the field of memory devices. More particularly, the present invention relates to an apparatus and method for utilizing partially defective memory devices which in the past would have been scrapped because of their defects. Still more particularly, the present invention relates to an apparatus and method for utilizing partially defective 16K dynamic RAMs which are characterized as having all faults within a contiguous address space which is one sixteenth of the total device address space.

The use of solid state memory devices has proliferated at a rate that has outpaced the increase in production capability for such devices. As a result, the demand for selected devices far outstrips supply and premium prices are demanded for such devices. The problem is particularly acute in the supply of the 16K dynamic RAMs utilized in computer memories, with annual shortfalls of multiple millions of units predicted in the near term.

Part of the supply problem is due to the fact that a large portion of the 16K dynamic RAM chips produced contain some defect(s) which make them unusable. In the prior art, methods to allow the use of some partially defective RAM chips have been recognized. One of these methods relies on a low density of faulty chip locations to permit error correction. Its disadvantage lies in the fact that error correction requires an overhead of memory storage which is dependent on the number of bits in a word and the number of errors it is desired to be able to correct.

Another method depends on defining the faulty locations once a memory board is fully assembled, and installing logic (such as a PROM) to allow mapping of those locations. This method suffers from the fact that definition of faulty locations when a board is assembled is inadequate due to the difficulty of reproducing worst case physical and electrical environments at a board test station. Further, permitting random faulty locations requires considerable overhead logic to permit mapping. For instance, one PROM location may be required for each board address.

The distribution of faulty locations in dynamic RAM chips is a function of, amongst other things, wafer defect density, thin oxide integrity, lithography defects, and process tolerances. The faults may be either hard, as in the case of a short circuit, or marginal, as in the case of a poor sense amplifier. In a typical process, about 60% of the 16K devices that are mostly functional may be classified as having all faults within a contiguous address space which is one sixteenth of the total device address space. It is a general object of the present invention to take advantage of the latter mentioned characteristic of semiconductor dynamic RAM manufacturing techniques by providing a low cost apparatus and method of utilizing some of these partially defective memory devices to form a memory system which appears to be faultfree.

It is another object of the present invention to provide an apparatus and method of utilizing partially defective memory devices wherein error correction systems are not required, and therefore may be added, as desired, to perform their normally intended function of data integrity improvement.

It is still another object of the present invention to provide an apparatus and method of utilizing partially defective memory devices which includes a mapping capability requiring minimum logic to implement and one wherein the mapping function is defined by the specification of the memory devices used.

It is yet another object of the present invention to provide an apparatus for utilizing partially defective 16K dynamic RAMs wherein no additional forms of memory, such as PROM, are required to implement the apparatus.

It is a further object of the present invention to provide a practical, volume-production oriented mapping system to permit use of memory devices with specific faulty areas.

It is an additional object of the present invention to provide a mapping system to permit use of partially defective and therefore inexpensive memory devices, any and all of said partially defective memory devices being replaceable with faultfree memory devices upon failure in the field.

It is still a further object of the present invention to provide a mapping system to permit use of partially defective memory devices wherein a portion of a mapping memory device is automatically allocated for each of the partially defective memory devices.

These and other objects, features and advantages of the present invention will become more apparent from the detailed description of the preferred embodiment when read in conjunction with the drawings.

SUMMARY OF THE INVENTION

In accordance with the present invention, a mapping system to permit use of memory devices with specific faulty areas is provided.

In the preferred embodiment, sixteen rows of 16K partially defective dynamic RAMs (or partial devices) are configured to form a contiguous 256K addressable storage area. The defects in each of the sixteen rows of partial devices are confined to a 1K segment, the start of each of the defective 1K segments being on a 1K address boundary and at the same relative position within its respective partial device. An additional faultfree 16K dynamic RAM is provided as the mapping device to complete the storage unit.

During the first phase of an access to the storage unit, the first address segment is presented to the row of 16 partial devices and each of the partial devices is clocked with a row address strobe. While the first address segment is being presented to the row of 16 memory devices, the second address segment is compared with the address combination which defines the faulty area of the partial memory devices being accessed. If a match is obtained, the second half of the access cycle to the partially defective memory devices is inhibited and their cycle is permitted to terminate as a refresh cycle.

While the first phase of the above memory cycle is proceeding, a similar cycle is initiated, with the same first segment of address, to the faultfree memory device which is reserved for the mapped locations. If the comparison made above does not result in a match, then the access to the mapping memory device is permitted to terminate in a refresh cycle as above. If a match is obtained, then the second segment of address is presented to the mapping device, except that the four most significant address bits are replaced with the address bits which define the one of the sixteen partial devices which would have been accessed if the comparison had not resulted in a match. In such case, the access is thus directed to the area in the mapping device allocated for the intended partial device.

DESCRIPTION OF THE PREFERRED EMBODIMENT

Figure 1:
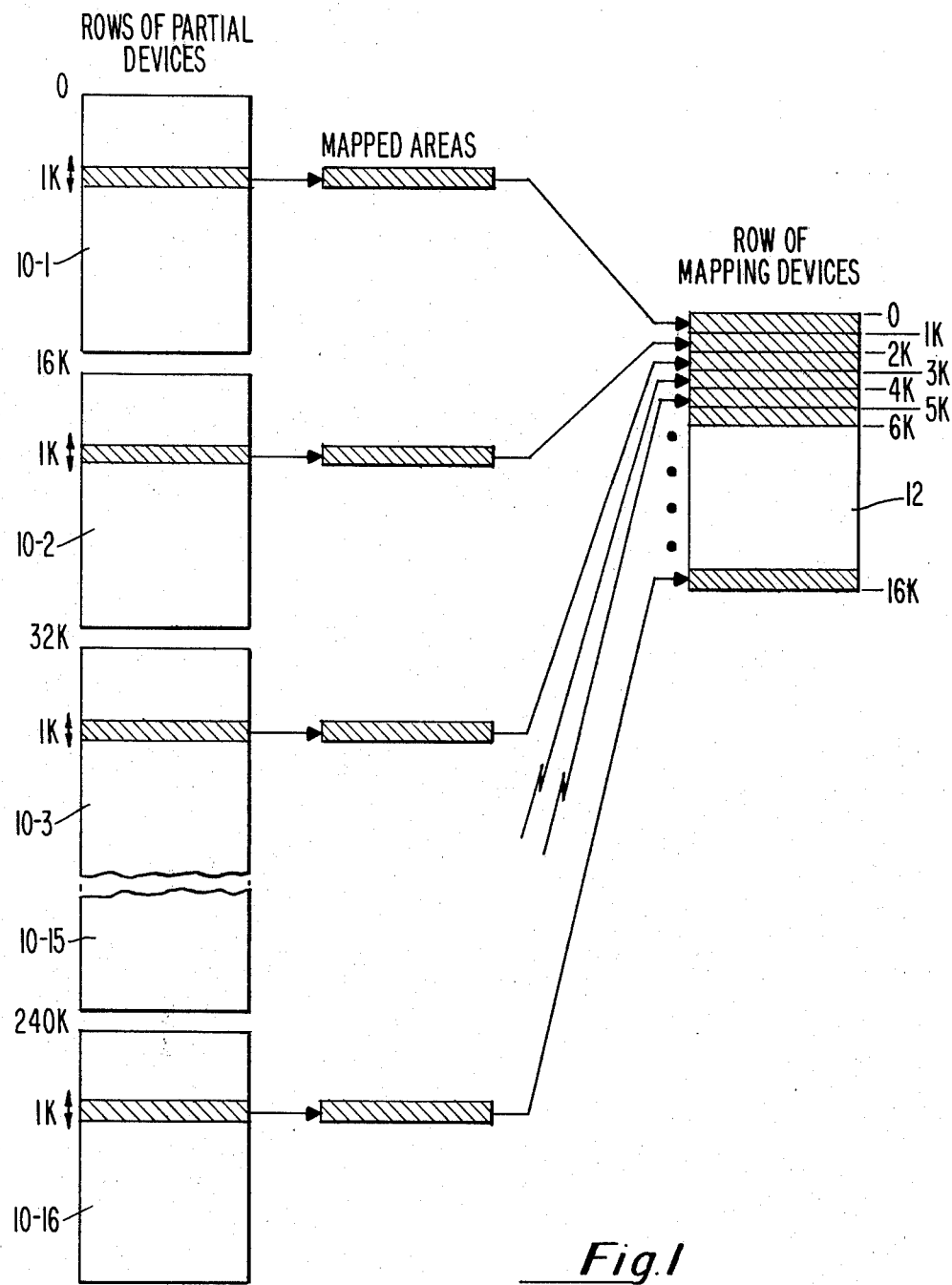
FIG. 1 is a block diagram showing the method of mapping utilized in the apparatus and method of the present invention.

As an aid to understanding the present invention, a brief description of some pertinent characteristics of 16K dynamic random access memories (RAMs) will be provided. This description will most often relate to the device which has become the industry standard for 16K dynamic RAMs, the MOSTEK MK-4116.

The array of storage locations within a 16K dynamic RAM, hereinafter also called a "device", tends to be a square. Thus, in a 16K device there are 128 rows, with each row having 128 storage locations. Accessing one of the 16,384 (or 16K) storage locations of a device is a two phase operation. In the first phase, a complete row of 128 storage locations are read out into 128 sense amplifiers on the device chip. In the second phase, one of the 128-one bit storage locations held by the sense amplifier is read out.

In order to implement this two phase access, the address of the desired location must be inputted to the device in two segments. Seven address input pins are provided in each device. In the first phase, seven address bits, specifying one of 128 rows of storage locations, are applied to the device's address pins and validated with a clock signal called the Row Address Strobe (RAS). Next, seven address bits, specifying which of these 128 bits of information that have been read into the sense amplifiers is to be provided to the device's outside pins, are input to the same address pins and validated with a clock signal called the Column Address Strobe (CAS). In most typical devices, the negative going edge of these clocks strobes the address on the input pins into buffers on the device chip.

In the typical device, fifty to sixty nanoseconds must elapse between presenting the first and second address segments. Typically, the access time to get data to the output of a device is 200 nanoseconds from the Row Address Strobe. However, those skilled in the art will appreciate that with actual board overhead taken into account this time may be closer to 350 nanoseconds.

Devices such as that being described must be refreshed within required time limits in order to maintain the integrity of the stored data. The device is refreshed by reading data from it. Thus, when the Row Address Strobe is activated, the row of storage locations specified by the address pin inputs is read out into the sense amplifiers and the internal device circuitry automatically writes the data in the sense amplifiers back in, thus reinforcing the voltage levels within the device. By performing the first phase of a read operation to each of the 128 possible row addresses, all 16,384 locations in the device are refreshed. In most applications, the system hardware includes logic to assure that a read operation is initiated to each of the 128 rows within the required time limit, which may typically be in the range of two milliseconds.

To inhibit the second half of an access cycle to a device and permit it to terminate as a refresh cycle, the control circuitry just does not enable the driver which drives the Column Address Strobe, so that the clock remains in a high state. There is no need to reset the device before initiating another access. To initiate another access, the control circuitry can just provide another first segment address and strobe the Row Address Strobe.

In the discussion to follow, consideration will not be given to the various setup and hold times required by the devices. These times will vary depending on the device type being used and the particular requirements of the device type will be readily apparent to those skilled in the art.

Referring now to the drawings, FIG. 1 illustrates the mapping concept implemented by the present invention. As shown, sixteen 16K dynamic rams 10-1 to 1-16 may be configured so that they form 256K bits of contiguous, addressable storage. It is assumed that the 16 partial devices 10-1 to 10-16 have been selected as having all of their faults within a contiguous address space which is one sixteenth of the total device address space, or 1K. Still further, in the preferred embodiment of the present invention it is assumed that the latter mentioned 1K contiguous address space occupies the same relative position in each partial device 10-1 to 10-16 and further that the start of each of the 1K contiguous address spaces is at an address that is some multiple of 1K.

The mapping device 12 is another 16K dynamic RAM which in the preferred embodiment is assumed to have no faults. There is thus presented a situation where there are sixteen 1K defective address segments in the partial devices 10-1 to 10-16 and sixteen 1K faultfree address spaces in the mapping device 12. Assuming that the 256K locations in the partial devices 10-1 to 10-16 may be consecutively addressed, then the addresses of all locations in each of the defective 1K address segments in each of the 16 partial devices 10-1 to 10-16 will have identical address bit positions 10 to 13, where bit position 0 is the least significant address bit position. Conversely, any address which does not have address bit positions 10 to 13 specifying a location in any of the defective 1K address spaces is assumed to be a faultfree location.

In the preferred embodiment, each defective 1K address space may be considered a mapped area with a corresponding faultfree 1K block located in mapping device 12. Thus, for example, the first 1K block in mapping device 12 provides a mapping area for the defective 1K address space in partial device 10-1, and the third 1K block in mapping device 12 provides a mapping area for the defective 1K address space in partial device 10-3.

In operation, each time an access is made to an address within one of the defective 1K address spaces in one of the partial devices 10-1 to 10-16, the present invention routes the access to the corresponding 1K mapped area in mapping device 12.

The present invention's ability to correctly route to the proper 1K block in the mapping device 12 derives from the use of address bits 14 to 17 which normally specifiy which one of the 16 partial devices 10-1 to 10-16 is being accessed. Thus, if address bits 10 to 13 indicate that an access is being made to a location within a defective 1K address space, the present invention will route the access to the corresponding one of the sixteen 1K blocks in mapping device 12 based on the contents of address bit positions 14 to 17.

As stated previously, a 16K dynamic RAM (or device) requires that the address of any location be presented in two segments at separate times during the device access cycle. In the preferred embodiment of the present invention, the first segment includes the seven least significant address bits and the second segment includes the seven high order address bits, a total of 14 address bits being required to specify one of the 16K device locations.

Figure 2:
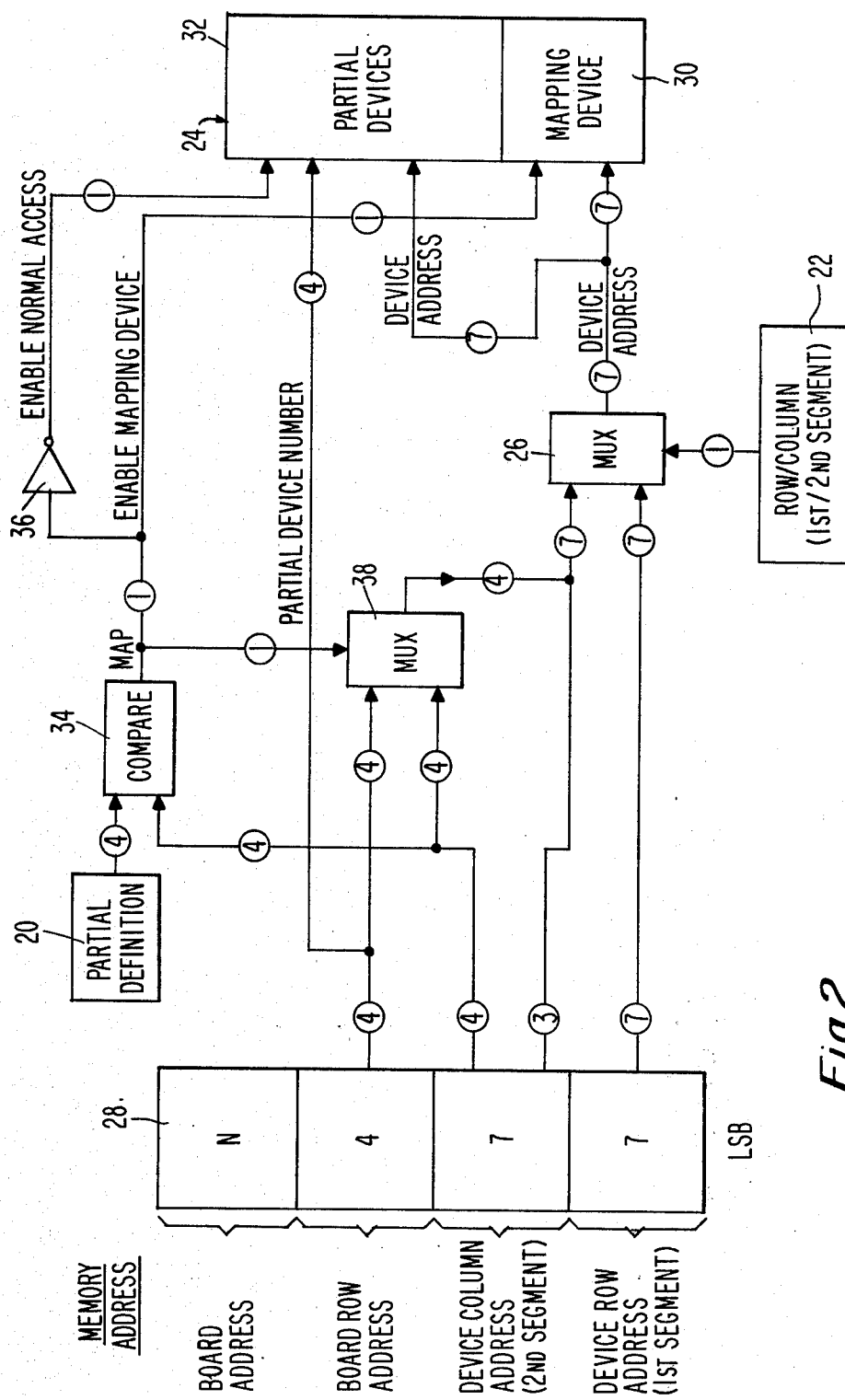
FIG. 2 is a block diagram illustrating the preferred embodiment of the apparatus of the present invention.

Referring now to FIG. 2, in the preferred embodiment of the invention, seventeen rows of devices are included on each board, the board providing one quarter megabytes of addressable storage, the seventeenth device providing a mapping device 30 for the sixteen partially good devices 32.

Partial definition storage unit 20 is used to store four bits which define the defective 1K segment in each partial device. Thus, for example, if the third from lowest (or fourth) segment of each 16K device contained the defective segment, then a binary 3 would be stored in storage unit 20. Recalling the earlier discussion, it will be appreciated that the partial definition bits stored in storage unit 20 correspond to bits 10 to 13 of the storage address, bit 0 of the storage address being considered as the least significant bit.

When an access to the board is initiated, the row-/column control logic 22 switches to gate the first segment of the address to the storage unit 24. That is, row-/columncontrol logic 22 signals multiplexor 26 to gate its lower input. Thus, the seven low order storage address bits from memory address register (MAR) 28 are gated through multiplexor 26 and inputted to the seven address input pins of both the row of 16K dynamic RAM mapping devices 30 and the 16 consecutively addressed rows of partial devices 32. Next, the control logic (not shown) activates the row address strobe (RAS) to both the row of mapping devices 30 and the rows of partial devices 32, thus initiating the first phase access to both the row of mapping devices 30 and the 16 rows of partial devices 32.

While the first address segment is being presented to the storage unit 24, the high order four bits of the device column address, viz., bits 10 to 13 of memory register 28, are compared with the partial definition in storage unit 20 by compare unit 34. If there is an exact match, indicating that the address being accessed is within the faulty area of one of the partial devices 32, the MAP output of compare circuit 34 goes positive. The MPA signal is inverted by inverter 36 and sent to the partial devices 32, which is effective to inhibit the second half of the access cycle to the partial memory devices 32. In such case, the access cycle to the partial devices 32 terminates as a refresh cycle.

If the compare operation does not result in a match, then the output of compare circuit 34 is negative, thus causing an enabling signal to be sent from the output of inverter 36 to partial devices 32, and a disabling signal to be sent to mapping device 30. Such condition indicates that the access is not to a defective segment of one of the partial devices 32. The negative signal from compare circuit 34 causes multiplexor circuit 38 to gate storage address bits 10 to 13 from memory address register 28 to the upper input of multiplexor 26. Next, the control logic 22 signals multiplexor 26 to gate its upper set of inputs. This effectively results in bits 7 to 13 from memory address register 28 being inputted in an unaltered form to the seven address input pins of both the row of mapping devices 30 and the 16 consecutively addressed rows of partial devices 32. Next, the control logic (not shown) activates the column address strobe (CAS) to both the mapping devices 30 and partial devices 32. However, since the mapping device 30 is in a disabled state, the second phase of the access to it is inhibited. As for the partial devices 32, each of the partial devices 32 of the selected row completes the second phase of the access. Selection of which of the sixteen rows of partial devices 32 the access is directed to is dependent on the board row address bits (FIG. 1). The circuitry required to implement the decoding of the board row address in this case will be obvious to those skilled in the art.

The discussion will next be directed to the case when the compare operation 34 does result in a match, indicating an access directed to a location in a defective segment of one of the rows of partial devices 32. As previously mentioned, in such case the enable access signal sent from inverter 36 to partial devices 32 is inactive, which will block any attempt to start the second phase of an access to the partial devices 32. The positive MAP signal resulting from the compare equal condition is inputted to multiplexor 38, resulting in the upper set of inputs, memory address register 28 bits 14 to 17 being substituted for MAR 28 bits 10 to 13 respectiveloy, at the upper set of inputs to multiplexor 26. Next, the control logic 22 signals multiplexor 26 to gate its upper set of inputs. This effectively results in storage address bits 7 to 10 and 14 to 17 from MAR 28 being inputted to the seven address input pins of both the row of mapping devices 30 and the 16 rows of consecutively addressed partial devices 32. Next, the control logic (not shown) activates the column daddress strobe (CAS) to both the row of mapping devices 30 and the rows of partial devices 32. However, since the partial devices 32 are in a disabled state, the second phase of the access to them is inhibited. As for the row of mapping devices 30, it completes its second phase access by choosing one of the 128 locations in the row selected during the first phase, the selection controlled in part by which one of the 16 rows of partial devices 32 the access would have been to if the location addressed had not been in a defective area.

Having shown and described the preferred embodiment of the present invention, those skilled in the art will realize that various omissions, substitutions and changes in forms and details of the present invention may be made without departing from the spirit of the invention.

Thus, rather than requiring all sixteen rows of partial devices to have their defective 1K segment at the same relative position, by expanding the partial definition memory 20 and the compare circuitry 34, the defective 1K segment could be located anywhere within each partial device.

A still simpler variation than the latter mentioned one would allow the defective 1K segment to be located starting on any 1K boundary in each partial device. In such case, the partial definition circuitry 20 could be implemented as a table listing each of the sixteen 4-bit board row addresses (FIG. 1) and the associated four bits defining which of the corresponding row of partial devices' 1K was defective. By expanding the compare circuitry 34 so that it additionally receives inputs from MAR bits 14 to 17, the compare circuitry 34 could then test whether the location being accessed was within the defective 1K block for the specified partial device. No other additional circuit modifications (other than those described) would be required to implement such a capability.

Those skilled in the art will additionally realize that the present invention is not limited to use with only 16K dynamic RAMs, but can readily be adapted for use with other device technologies. Further, it is not required that a full 256K storage unit be included. Thus, for example, the present invention can be implemented with five rows of partial devices and a row of mapping devices having a 5K storage capacity.

As those skilled ion the art will appreciate, additional variations of the present apparatus and method may be made without departing from the spirit of the invention.

What I claim is:

1. A mapping system to permit use of a group of partially defective memory devices as a memory unit, each of said partially defective memory devices characterized as having all of its respective faults within a contiguous address space, said mapping system comprising:

mapping memory means for storing data which would be stored in the defective areas of said group of partially defective memory devices if said group of partially defective memory devices were faultfree;

detection means, coupled to the address input lines to said memory unit, said detection means for detecting when an access is directed to the defective area of one of said group of partially defective memory devices;

enabling means, connected to said group of partially defective memory devices and responsive to said detection means, said enabling means for selectively enabling accesses to said group of partially defective memory devices or said mapping memory means; and redirect means, coupled to the address input lines to said memory unit and responsive to said detection means, said redirect means for redirecting an access to one of said defective areas to a corresponding mapping storage area in said mapping memory means, said redirect means including multiplexor means, responsive to an indicated access to said mapping memory means, said multiplexor means for replacing information on a subset of the address input lines to said mapping memory means.

2. The mapping system in accordance with claim 1 further including means, connected to the output of said group of partially defective memory devices and the output of said mapping memory means, and responsive to said enabling means, for selectively providing as the output of said memory unit, the output of said group of partially defective memory devices or the output of said mapping memory means.

3. The mapping system in accordance with claim 1 wherein:

said group of partially defective memory devices are configured to form one contiguously addressable storage area; and said detection means includes means for storing address information indentifying each of the defective storage areas of the group of partially defective memory devices.

4. The mapping system in accordance with claim 1 or 3 wherein said mapping memory means is characterized as having a number of said mapping storage areas at least equal to the number of partially defective memory devices in said group, each of said mapping storage areas having a storage capacity at least equal to the size of the defective area of the corresponding partially defective memory device.

5. A mapping system to permit use of a group of partially defective memory devices as a memory unit, each of said partial devices characterized as requiring the address of any location to be presented in at least two segments at separate times during a partial device address cycle, each of said partial devices further characterized as having all of its respective faults within a contiguous address space, said group of partial devices configured to form one continuous storage area, said mapping system comprising:

mapping memory means for storing data which would be stored in the defective areas of said group of partial devices if said group of partial devices were faultfree, said mapping memory means characterized as requiring the address of any location to be presented in a least two segments at separate times during an access cycle to said mapping memory means, the first and second segments of both the mapping memory means address and the partial device address presented during first and second stages of a memory unit access, respectively;

detection means, coupled to the address input lines to said memory unit, said detection means for detecting when an access is directed to the defective area of one of said partial devices, said detection means including partial definition storage means for storing information indicating the addresses of the defective areas in the group of partial devices, and compare means, connected to said partial definition storage means and responsive to the first stage of a memory unit access, said compare means for comparing portions of the address of the location to be accessed with information in said partial definition storage means; and enabling means, connected to said group of partial devices and responsive to said detection means, said enabling means for selectively enabling or disabling accesses to said group of partial devices or said mapping memory means.

6. The mapping system in accordance with claim 5 wherein said enabling means includes means, responsive to said compare means, said means for:

disabling said mapping memory means in response to said compare means indicating that a memory unit access is not to a defective area; and disabling said group of partial devices in response to said compare means indicating that a memory unit access is to a defective area.

7. The mapping system in accordance with claim 6 wherein:

in response to said group of partial devices being disabled by said enabling means, said group of partial devices will not perform the second stage of its access; and in response to said mapping memory means being disabled by said enabling means, said mapping memory means will not perform the second stage of its access.

8. The mapping system in accordance with claim 5 further including redirect means, coupled to the address input lines of said memory unit and to said compare means and responsive to a memory unit access to one of said defective areas in said group of partial devices, said redirect means for modifying the second segment address to direct the second stage access to a storage area in said mapping memory means allocated to the defective segment being addressed.

9. The mapping system in accordance with claim 8 wherein said mapping memory means is characterized as having a number of mapping storage areas at least equal to the number of partial devices in said group, each of said mapping storage areas having a storage capacity at least equal to the size of the defective area of the corresponding partial device.

10. The mapping system in accordance with claim 8 wherein said redirect means includes multiplexor means, responsive to a memory unit access to one of said defective areas, said multiplexor means for replacing information on a subset of the input lines to said mapping memory means.

11. The mapping system in accordance with claim 6 further including means, connected to the input/output data pins of said group of partial devices and the input/output data pins of said mapping memory means and responsive to said enabling means, said means for switching the input/output data lines of said memory unit between the input/output data pins of said group of partial devices and the input/output data pins of said mapping memory means.

12. The mapping system in accordance with claim 9 wherein each defective area in such of said partial devices is located starting at the same relative position within its respective partial device.

13. The mapping system in accordance with claim 12 wherein each defective area in each of said partial devices is the same size.

14. The mapping system in accordance with claim 8 wherein:
each of said partial devices has a storage capacity of 16K addressable cells;
the group of partial devices includes sixteen of said partial devices configured to form 256K contiguously addressable storage cells, the storage cells to be accessed specified by an eighteen bit memory unit address, the four high order address bits specifying which of the sixteen partial devices contains the desired storage cell, the low order fourteen address bits specifying which one of the 16K storage cells within the specified partial device is to be addressed; and
the mapping memory means includes a mapping memory device having a storage capacity of 16K addressable storage cells, the mapping memory device having seven address input lines, the information on the four high order address input lines presented during the second stage specifying one of sixteen 1K storage cell mapping areas in the mapping memory device.

15. The mapping system in accordance with claim 14 wherein said redirect means, in response to said compare means indicating a memory unit access directed to one of said defective areas, will replace the four high order address bits that would normally be presented to the mapping memory device and the group of partial devices during the second stage of an access to a location that is not within a defective area with the four high order bits of the eighteen bit memory unit address.

16. The mapping system in accordance with claim 15 wherein each of said defective areas is defined as including 1K storage cells, the start of each of said defective areas being on a 1K address boundary.

17. The mapping system in accordance with claim 16 wherein each of said defective areas is at the same relative address position within its respective partial device.

18. The mapping system in accordance with claim 17 wherein said partial definition storage means is used to store the four bit positions specifying which of the 1K segments of each partial device is defective, said partial definition compared by said compare means with bit positions 10 to 13 of the eighteen memory unit address.

19. The mapping system in accordance with claim 15 wherein each of said partial devices and said mapping memory device include a 16K dynamic random access memory.

20. A method of utilizing a group of partially defective memory devices in conjunction with a single faultfree memory device to form an effectively faultfree memory unit, each of said partial devices and said faultfree device characterized as requiring an address input to be presented in at least two segments at separate times during an access cycle, each of said partial devices characterized as having all of its respective faults within a contiguous address space, said group of partial devices configured to form one continuous addressable storage area, said method comprising the steps of:
a. presenting the first segment of the address of the location to be accessed to said group of partial devices and to said faultfree device and then initating a first stage access to said group of partial devices and to said faultfree device;
b. concurrent with said step a, comparing the second segment of the address of the location to be accessed with address information which identifies the faulty areas of the partial devices being accessed;
c. if a match is obtained in said step b,
c1. modifying the second segment of the address of the location to be accessed to specify an address in a portion of the faultfree device allocated for the corresponding partial device, and
c2. presenting the modified second segment of the address of the location to be accessed to the faultfree device; and
d. if a match is not obtained in said step b,
d1. presenting the unmodified second segment of the address of the location to be accessed to the group of partial devices.

21. The method in accordance with claim 20 wherein:
said step c further includes, after said step c2, the additional step of initating a second stage access to said faultfree device;
said step d further includes, after said step d1, the additional step of initiating a second stage access to said group of partial devices.

22. The method in accordance with claim 21 wherein said step d1 is replaced by the following step:
d11. presenting the unmodified second segment of the address to the partial device indicated in the address of the location to be accessed.

23. The method in accordance with claim 20 and 21 wherein:
said step c includes the additional step of inhibiting the second half of the access cycle to the group of partial devices;
and
said step d includes the additional step of inhibiting the second half of the access cycle to the faultfree device.

24. The method in accordance with claim 21 further including the following additional step after said step d:
e. presenting at the output of said effectively faultfree memory unit the output of the device to which the second stage access was initiated.

* * * * *

UNITED STATES PATENT AND TRADEMARK OFFICE
CERTIFICATE OF CORRECTION

PATENT NO. : 4,355,376
DATED : 19 October 1982
INVENTOR(S) : Robert T. M. Gould

It is certified that error appears in the above-identified patent and that said Letters Patent is hereby corrected as shown below:

Column 5, line 32, change "columncontrol" to --column control--.

Column 7, after line 16, insert --It is the intention therefore, to be limited only as indicated by the scope of the following claims.--

In Claim 5, at column 8, line 12, change "address" to --access--.

In claim 12, at column 9, line 30, change "such" to --each--.

In claim 14, at column 9, line 42, change "the storage cells" to --the storage cell--.

In claim 14, at column 9, line 49, change "addressed" to --accessed--.

In claim 23, at column 10, line 55, change "and" to --or--.

Signed and Sealed this

Twenty-eighth Day of June 1983

[SEAL]

Attest:

GERALD J. MOSSINGHOFF

Attesting Officer

Commissioner of Patents and Trademarks